United States Patent
Hazlett

(10) Patent No.: US 6,927,086 B2
(45) Date of Patent: Aug. 9, 2005

(54) METHOD AND APPARATUS FOR LASER DIODE ASSEMBLY AND ARRAY

(75) Inventor: Dwight K. Hazlett, Rio Rancho, NM (US)

(73) Assignee: Decade Products, Inc., Albuquerque, NM (US)

( * ) Notice: Subject to any disclaimer, the term of this patent is extended or adjusted under 35 U.S.C. 154(b) by 69 days.

(21) Appl. No.: 10/671,118

(22) Filed: Sep. 24, 2003

(65) Prior Publication Data

US 2004/0115911 A1 Jun. 17, 2004

Related U.S. Application Data

(60) Provisional application No. 60/413,905, filed on Sep. 24, 2002.

(51) Int. Cl.[7] .............................. H01L 21/00
(52) U.S. Cl. ............ 438/28; 438/26; 438/27; 438/107; 438/109; 438/117
(58) Field of Search ............ 438/26–28, 107, 438/109, 117

(56) References Cited

U.S. PATENT DOCUMENTS

| | | |
|---|---|---|
| 4,092,614 A | 5/1978 | Sakuma et al. |
| 4,881,237 A | 11/1989 | Donnelly |
| 4,903,274 A | 2/1990 | Taneya et al. |
| 4,947,401 A | 8/1990 | Hinata et al. |
| 4,980,893 A | 12/1990 | Thornton et al. |
| 5,031,187 A | 7/1991 | Orenstein |
| 5,040,187 A | 8/1991 | Karpinski |
| 5,060,237 A | 10/1991 | Peterson |
| 5,061,974 A | 10/1991 | Onodera et al. |
| 5,099,488 A | 3/1992 | Ahrabi et al. |
| 5,105,430 A | 4/1992 | Mundinger |
| 5,128,951 A | 7/1992 | Karpinski |
| 5,212,707 A | 5/1993 | Heidel et al. |
| 5,284,790 A | 2/1994 | Karpinski |
| 5,305,344 A | 4/1994 | Patel |
| 5,311,535 A | 5/1994 | Karpinski |
| 5,325,384 A | 6/1994 | Herb et al. |
| 5,394,426 A | 2/1995 | Joslin |
| 5,418,799 A | 5/1995 | Tada |
| 5,440,577 A | 8/1995 | Tucker |
| 5,497,391 A | 3/1996 | Paoli |
| 5,526,373 A | 6/1996 | Karpinski |
| 5,568,498 A | 10/1996 | Nilsson |
| 5,627,850 A | 5/1997 | Irwin |
| 5,644,586 A | 7/1997 | Kawano et al. |
| 6,352,873 B1 * | 3/2002 | Hoden .......................... 438/28 |
| 6,759,723 B2 * | 7/2004 | Silverbrook ................ 257/433 |
| 2004/0219700 A1 * | 11/2004 | Silverbrook ................. 438/22 |

* cited by examiner

*Primary Examiner*—Christian Wilson
(74) *Attorney, Agent, or Firm*—Rod D. Baker; Peacock & Myers, P.C.

(57) ABSTRACT

A method and apparatus for assembling laser diode arrays. The invention includes the use of vacuum forces and a bi-metallic clip to place a diode array and substrate in proper alignment, and to maintain that alignment while solder pre-forms are melted in an oven to accomplish a mass fusion of the assembly.

24 Claims, 4 Drawing Sheets

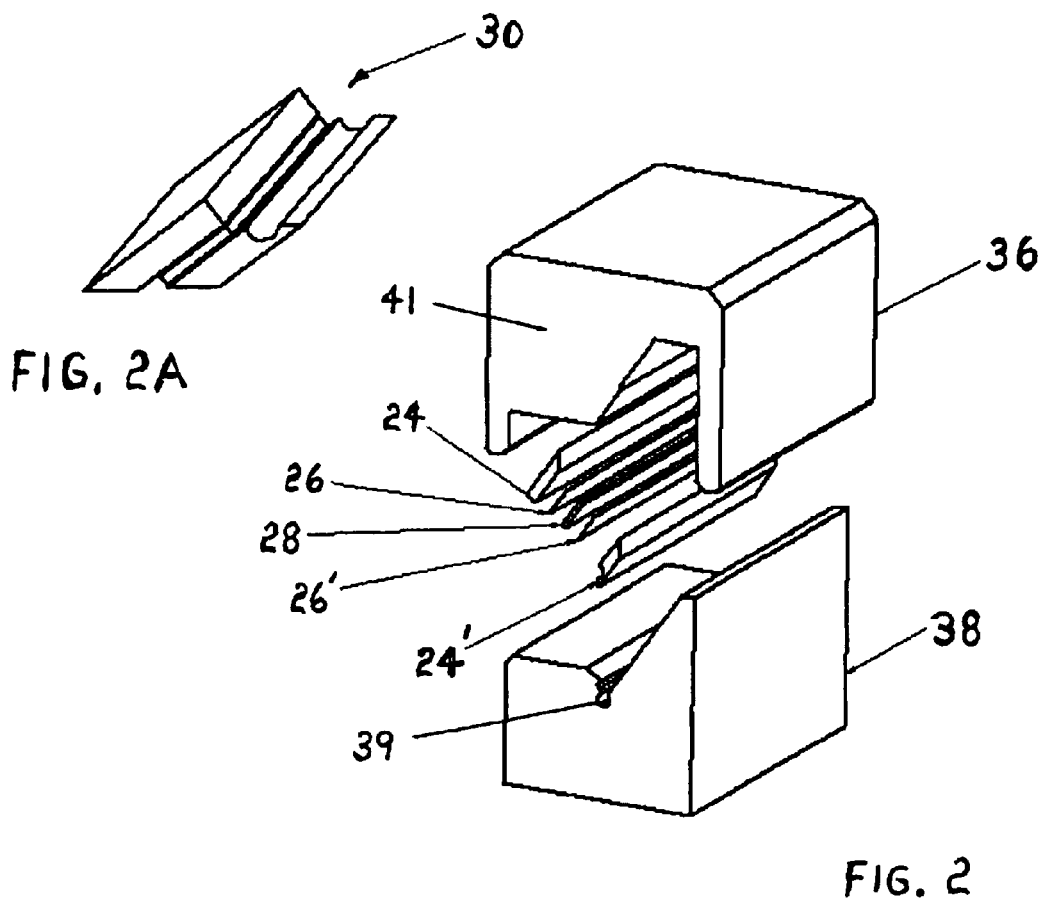
FIG. 2A
FIG. 2
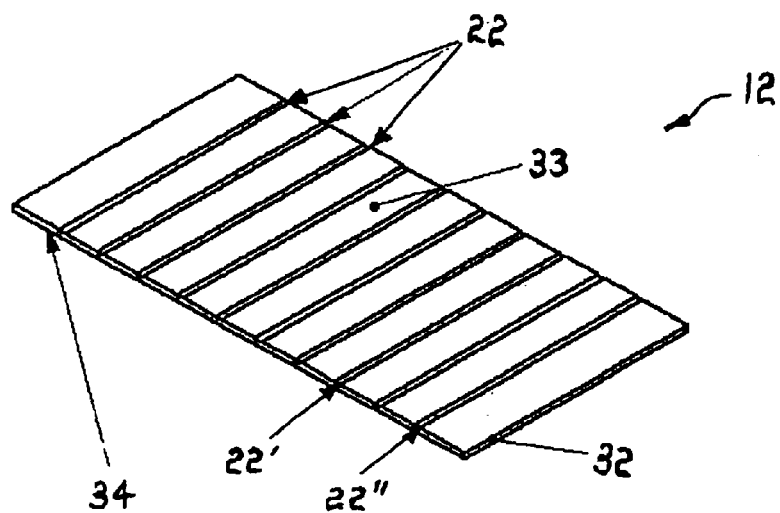
FIG. 3

METHOD AND APPARATUS FOR LASER DIODE ASSEMBLY AND ARRAY

CROSS-REFERENCE TO RELATED APPLICATIONS

This application claims the benefit of the filing of U.S. Provisional Patent Application Ser. No. 60/413,905, entitled "Method and Apparatus for Laser Diode Assembly and Array," filed on Sep. 24, 2002, and the specification thereof is incorporated herein by reference.

BACKGROUND OF THE INVENTION

1. Field of the Invention (Technical Field)

The present invention relates to laser diodes, particularly to a laser diode assembly and method of assembly which permits rapid, yet accurate, spacing and alignment of minute diode bars, as well as efficient cooling of diode bars and electrical conductivity through the diode bars.

2. Background Art

Laser diode arrays are in use in a variety of industrial and research applications. Pluralities of laser-emitting diode bars are mounted upon a substrate to provide the multiplied power of numerous bars, versus the very modest effect offered by a single bar. In many advanced applications, it is essential to array a large number of diode bars in close alignment, in order that high-power applications can be realized. To optimize the efficiency of a multiple diode bar array, it is desirable not only that the diode bars be closely aligned so that their emitter surfaces face the same direction (permitting effective use of lens assemblies to collimate the outputs), but that electrical conductivity between bars and cooling of the bars should be optimized.

Examples of helpful background art include U.S. Pat. No. 6,295,307 to Hoden et al., and U.S. Pat. No. 6,352,873 to Hoden, which have been assigned to the assignee of the present application, and which are incorporated herein by reference.

SUMMARY OF THE INVENTION (DISCLOSURE OF THE INVENTION)

The invention is a method and apparatus for assembling laser diode arrays. The invention includes the use of vacuum forces and a bi-metallic clip to place a diode array and substrate in proper alignment, and to maintain that alignment while solder pre-forms are melted in an oven to accomplish a mass fusion of the assembly.

Succinctly summarized, the inventive method for assembling a plurality of laser diode submodules comprises the steps of preparing the submodules; situating a substrate on a substrate carrier, the substrate having isolation grooves defined therein and solder thereon between the isolation grooves; disposing the submodules on a stacking block; applying a vacuum to the substrate to hold it in place against the carrier; aligning the submodules with the isolation grooves; biasing together the substrate carrier and the stacking block with an elastic bi-metallic clip; and heating the clip, block and carrier, with the substrate and submodules therein, until the solder melts and the bi-metallic clip opens due to thermal expansion.

There is preferable first step, the he step of preparing the submodules, which includes disposing a diode between two conductive preforms, arranging the diode and preforms between parallel spacers to constitute a submodule, placing the submodule between a conforming tool and a loading tool, and heating the submodule to melt the preforms.

The objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings:

FIG. 2 is an exploded end view of an array assembly according to the invention, together with certain assembly tooling used to practice the method of the invention;

FIG. 2A is a perspective side view of an assembled laser diode submodule according to the invention;

FIG. 3 is a perspective view of a pre-tinned component of the apparatus according to the invention;

DESCRIPTION OF THE PREFERRED EMBODIMENTS (BEST MODES FOR CARRYING OUT THE INVENTION)

This invention has to do with the packaging of laser diode bars into an array that allows series electrical continuity through the bars and provides thermal cooling. This invention includes an array apparatus, as well as methodology of fabrication. This invention has applications in many areas in which high power semiconductor laser arrays are used. Further understanding regarding the background and utility of this invention may be had by referring to U.S. Pat. No. 6,295,307 to Hoden et al., and No. 6,352,873 to Hoden.

The apparatus of invention features four primary components: the laser diodes, thermally/electrically conductive metal spacers, electrically insulative/thermally conductive ceramic substrate, and heat sink. The laser diodes are commercially available, off-the-shelf, from existing vendors. The metal spacers and ceramic substrate are machined to specification (customized as needed) and can vary depending on application. The heat sink may be purchased from existing vendors or made to specification.

Underlying the fabrication of the inventive array is the tooling and processing used to fabricate the diode assembly. The tooling and process is fundamental to the final product and includes four major aspects: the submodule assembly tooling, controlled atmosphere conduction/convection heating (in a device called a reflow oven), the submodule to substrate assembly tooling, and the submodule/substrate to heat sink assembly tooling.

Figure 1:
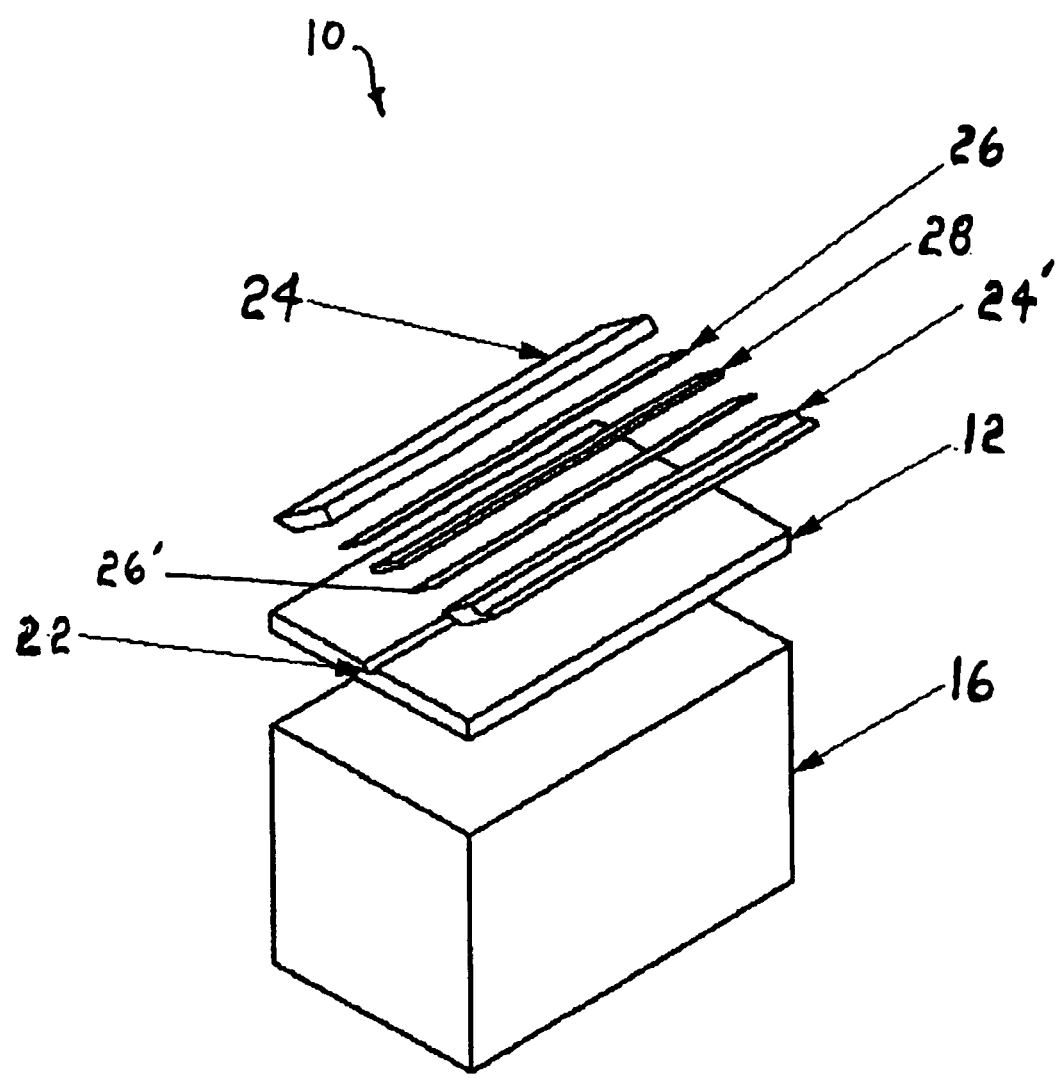
FIG. 1 is an exploded view, from above, of one embodiment of the array assembly according to the present invention.

Reference is made to FIG. 1, which shows a basic laser diode array assembly 10 for a "single bar" mounting. This assembly 10 may be constructed in a tilted configuration, as shown, or in a perpendicular arrangement. By increasing the size of the substrate 12 and heat sink 16 to provide multiple isolation grooves (one isolation groove 22 seen in FIG. 1), the size of the array 10 can be extended to accommodate as many diode bars 28 as desired.

The assembly 10 according to the invention, however, preferably includes a plurality of submodules 30, 30' mounted upon the substrate 12. As will be further explained, each submodule 30 features a laser diode 28, two "spacers," 24, 24' and two "preforms" 26, 26'. The heat sink 16, which may be actively cooled, functions generally according to known convention.

The spacers 24, 24' preferably are fashioned of a tungsten-copper composite, machined to dimension, and then electroplated with gold over nickel. The gold finish provides a tarnish-resistant, solderable, surface. The preforms 26, 26' supply a soldering alloy; they are preferably manufactured from a gold-tin alloy. The substrate 12 preferably is composed of aluminum nitride, and is metallized on its top and its bottom surfaces. The aluminum nitride substrate 12 provides electrical isolation and thermal conductivity between each spacer 24, 24' and the heat sink 16. The metallization preferably is gold over platinum over titanium, and provides a tarnish-resistant solderable surface. As seen in FIG. 1, an isolation groove 22 is machined in the top surface of the substrate 12 at a location corresponding to the situation of each diode 28 to be mounted, thereby creating an electrical path through the diode. It is readily evident to one skilled in the art that the number of mutually parallel isolation grooves 22 defined in the surface of the substrate 12 will correspond to the number of diodes 28 installed in the assembly 10. The heat sink 16 is typically gold plated copper, with some form of fins, or other structure in its interior, to improve heat transfer to a coolant used, if any. Alternatively, the heat sink 16 may be another temperature controlling device, such as a thermo-electric cooler.

The first step in the assembly process according to the invention is to compile a submodule 30, which when assembled appears as seen in FIG. 2A. Each submodule 30 includes a diode 28, two spacers 24, 24', and preforms 26, 26' soldered together. These components are stacked in an assembly tool, and then heated to the soldering temperature inside a reflow oven. The submodule 30 may then be tested, and passing test, is ready for the next step in the assembly process. FIG. 2 shows the components and assembly tooling.

Referring to FIG. 2, it is seen that the submodule assembly tool includes a confining tool 36 and a loading tool 38 which operate in tandem to confine the components of the submodule 30. Referring to FIG. 2, the loading tool 38 has a support channel 39 defined therein; the support channel 39 has parallel ledges, each ledge at a height and having a width to receive and support thereon a particular one of the submodule components. The bottom surface of the channel 39 receives the negative spacer 24', while the uppermost channel surface supports the positive spacer 24. The ledges in the channel 39 are pitched so to situate the components of the submodule 30 at the selected angle from vertical, if any, at which they will be soldered together.

The confining tool 36 is similarly contoured in its interior with a corresponding (but oppositely reflected) channel, with ledges, that likewise engage with the members of the submodule situated in the channel 39 to hold these members in place. The confining tool 36 and loading tool 38 are brought together to define a tube-like conduit (having a complex polygonal lateral cross section) in which the submodule 30 rests during processing. An end flap 41 at one or both ends of the confining tool 36 serves as an abutment against which the members of the submodule 30 can be axially aligned (so that the ends of the members are substantially co-planar). Thus contained and arranged within the confining and loading tools 36, 38, the submodule assembly may be passed through a conventional reflow oven for the selected length of time to melt the preforms and thus solder the submodule 30 together as a unit.

The substrate 12 is pre-tinned. The solder alloy preferably has the form of a foil, cut to match the surface area of the substrate 12. The surface of the substrate 12 with the isolation grooves 22, 22', 22" is coated with a thin layer of flux, then the precut foil of solder, herein called a preform 26, 26' is placed on the substrate surface 33, and the pair of components heated to the melt temperature of the alloy. When the alloy turns liquid, the gold surfaces 33 are wetted with solder; and surface tension simultaneously causes the liquid solder to withdraw from the isolation grooves 22, 22', 22" leaving them open and unmetallized. Further, the perimeter edges 32 of the substrate 12 are not metallized. The bottom surface 34 of the substrate 12 is gold metallized. Although the solder is not shown therein, FIG. 3 labels the features of a pre-tinned substrate 12.

Figure 4:
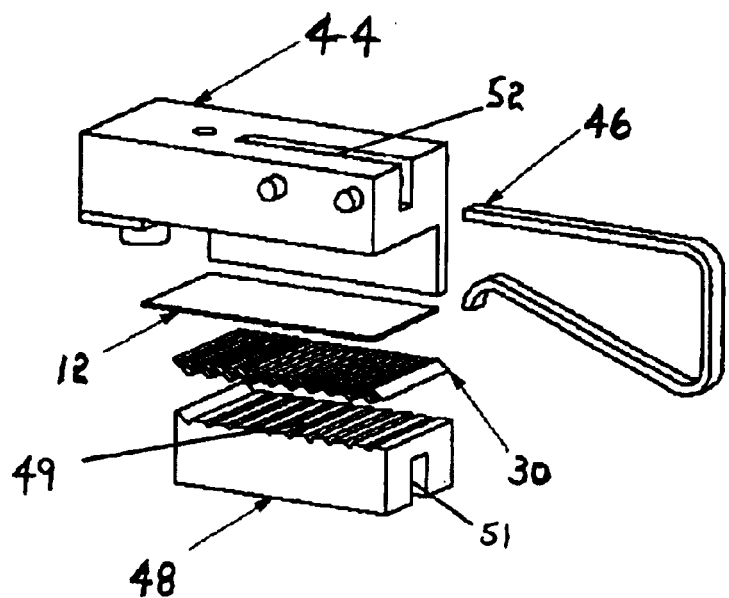
FIG. 4 is a perspective side view of components of the array assembly according to the invention, situated with the basic tool components for practicing the inventive assembly procedure.

The inventive method includes the subsequent step of soldering a plurality of submodules 30 to the substrate 12 in a one-step process of mass fusion. A set of tools is used to align the collection of submodules 30 over the isolation grooves 22, 22', 22" and hold them in place during the heating cycle of soldering. Reference is invited to FIG. 4, showing the basic components of the mass fusion tool system. An assembly of linear motion stages, a tip-tilt mount, vacuum plates, and an imaging system (not shown in FIG. 4) support, physically and/or operationally, the tool components seen in FIG. 4. A specially crafted substrate carrier 44 as seen in the figure is the tool against which the under-surface of the substrate 12 is placed in flush contact. A submodule stacking block 48 is configured with a corrugated stacking surface 49 with parallel grooves, each groove having a side inclined at a selected angle, against which the pre-assembled submodules can be leaned. As suggested by FIG. 4, the plurality of submodules 30 are disposed into corresponding ones of the grooves in the stacking surface 49, there to be held in the desired inclined and parallel array.

The substrate carrier 44 and the stacking block 48 each have a respective clip groove 52, 51 for receiving the bimetallic clip 46. Bimetallic clip 46 is crafted from two metals of differing coefficients of thermal expansion, such that the clip "opens" or "closes" at different temperatures. The clip 46 is manufactured according to principles known in the thermocouple and thermostat art.

The plurality of submodules 30 are situated onto the stacking surface 49 of the submodule stacking block 48, and the substrate 12 is then contactable with the array of submodules. The submodules 30 and substrate 12 thus are "sandwiched" between the substrate carrier 44 and the stacking block 48; the elastically flexible prongs of the clip 46 can be inserted into the clip grooves 51, 52, and the elastic "spring" of the clip holds this entire "core tool assembly" together.

Figure 5:
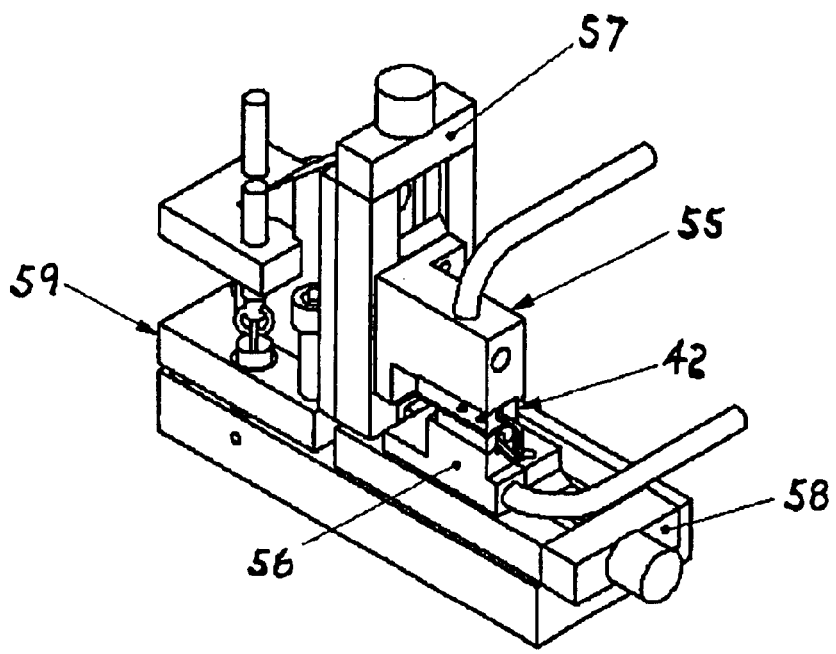
FIG. 5 is a simple diagram showing in perspective the core tools in use to practice the invention in assembling a diode array according to the invention.

FIG. 5 shows the core tool assembly 42 described, as held in place between upper vacuum plate 55, and lower vacuum plate 56, as well as the linear stages 57, 58 (of ordinary construction) and tip tilt mount 59. The substrate carrier 44 and the stacking block 48 have working faces in confronting relation to each other, and contactable with the plurality of submodules 30. The carrier 44 and block 48 have gas conduits there through in communication with minute apertures in the working faces, which permit a negative pressure (vacuum) to be exerted on any objects adjacent to the working faces. Thus, when the substrate carrier 44 is operably connected to the upper vacuum plate 55, and the stacking block 48 to the lower vacuum plate 56, a vacuum applied via the plates 55, 56 is applied to the tool assembly.

The stepwise use of this tooling may now be described. First, the substrate carrier 44 is placed against its vacuum plate 55. The plate is machined for accurate placement, and the air flowing into the plate 55 creates a suction holding the carrier 44 in place. Next, the pre-tinned substrate 12 is set in place in the substrate carrier 44. The applied vacuum retains it in place also. While the carrier 44 is separately held under the upper vacuum plate 55, the submodules 30 are placed in the submodule stacking block 48. The submodules 30 are held in the stacking block 48 by gravity. The block 48 and submodules 30 are then placed on the lower vacuum plate 56 and slid into place against machined surfaces. Vacuum through the lower vacuum plate 56 prevents the stacking block 48 from moving once properly situated.

Once all components are in place, a magnifying vision system (not shown) is used to view the relative positions of the components, particularly to align the submodules 30 with corresponding grooves in the substrate 12. While viewing the components under magnification in the vision system, the finely adjustable linear stages 57, 58 and tip-tilt 59 are used to bring the submodules 30 and substrate 12 together with accuracy. The diode bars 28 are accurately aligned visually with associated isolation grooves 22.

Figure 6:
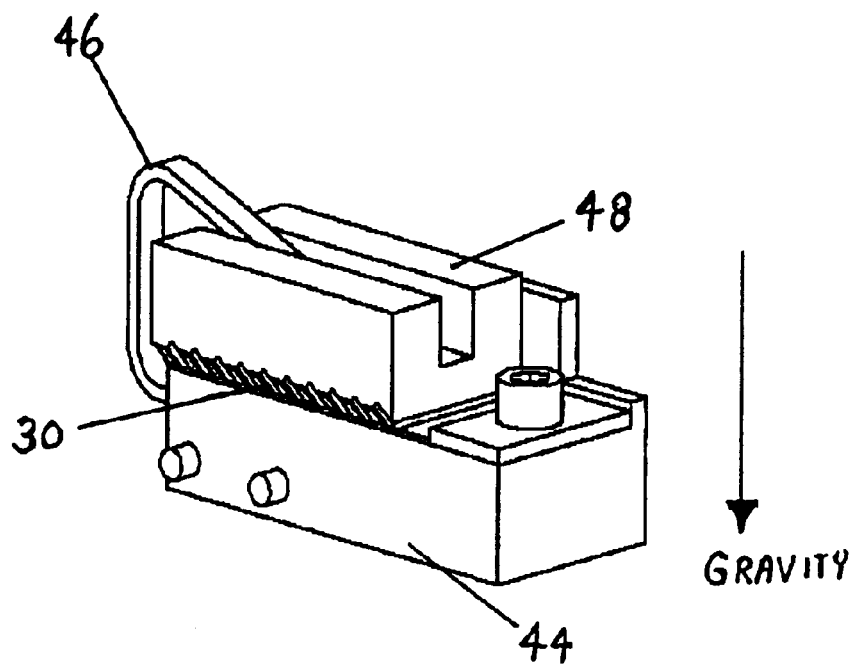
FIG. 6 is a side perspective view of the core tooling assembly according to the invention as oriented for placement into a reflow oven (not shown)

After the components are brought into proper axial alignment, the bimetallic clip 46 is installed in place. The clip 46 is situated by inserting it into grooves 51, 52 or channels in the blocks 48, 44. The clip 46 holds the parts together under spring tension, allowing the vacuum to be released and the assembly to be transported to the reflow oven. When placed in a reflow oven (not shown, but of known construction and operation) the basic tooling assembly is oriented as shown in FIG. 6, i.e., its position is inverted with respect to the initial orientation seen in FIG. 4, and gravity acting in the direction of the directional arrow of FIG. 6.

As the temperature of the assembly 10 rises in the oven, the bimetallic clip 46 "opens" to release its compressive spring force, due to the different coefficients of thermal expansion of the metals comprising the clip. The clip 46 is designed to open before the solder alloy reaches its melting point. Once the clip 46 has opened, it is the weight of the stacking block 48 that maintains the submodules 30 in place during the soldering process. As the assembly cools, the solder solidifies before the clip 46 begins re-contracting to re-apply force to the stacking block 48 and the submodules 30. Once cooled, the clip 46 and tools 44, 46, 48 are separated and the soldered assembly (called a tile) is removed.

Figure 7:
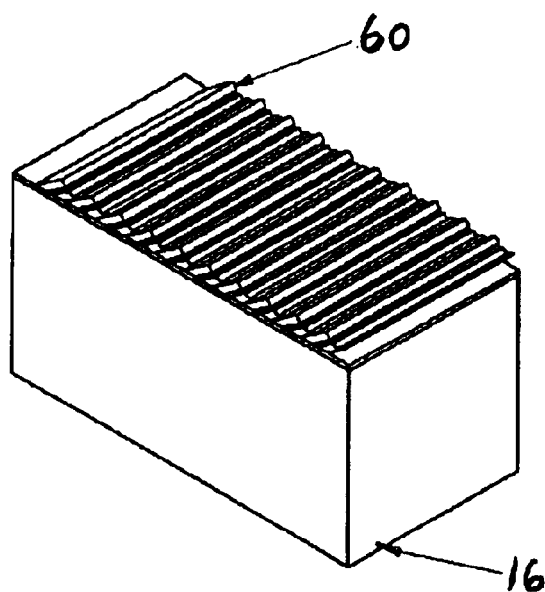
FIG. 7 is a perspective view, from above, of a completely assembled ten-bar tile array according to the invention, ready for disposition and operation in an appropriate larger device or system.

The completed tile is now ready to be attached to a heat sink, such as the heat sink 16, and electrical leads attached. These attachments are performed in an open air soldering process, again using a preform of solder and flux. Once the final assembly is completed, the array is ready for operation. FIG. 7 illustrates a ten-bar tile 60 on a water-cooled heat sink 16.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method for assembling a plurality of laser diode submodules comprising the steps of:

preparing the submodules;

situating a substrate on a substrate carrier, the substrate having isolation grooves defined therein and solder thereon between the isolation grooves;

disposing the submodules on a stacking block;

applying a vacuum to the substrate to hold it in place against the carrier;

aligning the submodules with the isolation grooves;

biasing together the substrate carrier and the stacking block with an elastic bimetallic clip; and heating the clip, block and carrier, with the substrate and submodules therein, until the solder melts and the bimetallic clip opens due to thermal expansion.

2. A method according to claim 1 wherein the step of preparing the submodules comprises the steps of:

disposing a diode between two conductive preforms;

arranging the diode and preforms between parallel spacers to constitute a submodule;

placing the submodule between a confining tool and a loading tool; and heating the submodule to melt the preforms.

3. A method according to claim 2 further comprising the step of electroplating the parallel spacers with gold over nickel.

4. A method according to claim 2 further comprising the step of making the performs of a gold-tin alloy.

5. A method according to claim 2 further comprising the step of providing a support channel within the loading tool.

6. A method according to claim 5 wherein the step of providing a support channel comprises providing a support channel having a contoured interior.

7. A method according to claim 5 wherein the step of providing a support channel comprises providing a support channel having an upper surface, a lower surface, and parallel ledges to support the diode, the performs, and the parallel spacers.

8. A method according to claim 5 wherein the step of providing a support channel comprises providing a support channel with a bottom surface to receive one of the parallel spacers and an upper surface to support the opposite spacer.

9. A method according to claim 2 further comprising the step of providing a support channel within the confining tool.

10. A method according to claim 9 wherein the step of providing a support channel comprises providing a support channel having a contoured interior.

11. A method according to claim 9 wherein the step of providing a support channel comprises providing a support channel having an upper surface, a lower surface, and parallel ledges to support the diode, the performs, and the parallel spacers.

12. A method according to claim 9 wherein the step of providing a support channel comprises providing a support channel having a bottom surface to receive one of the parallel spacers and an upper surface to support the opposite spacer.

13. A method according to claim 9 wherein the step of providing a support channel comprising a contoured interior comprises providing a contoured interior that is oppositely reflected to the contoured interior of the support channel of the loading tool.

14. A method according to claim 2 wherein the step of placing the submodule between the confining tool and the loading tool comprises bringing the confining tool and the loading tool together to form a conduit and disposing the submodule within the conduit.

15. A method according to claim 2 further comprising the step of providing an abutment at at least one axial end of the diode, the spacers, and the preforms to axially align the submodule.

16. A method according to claim 1 wherein the step of situating the substrate comprises providing a substrate that provides electrical isolation and thermal conductivity between the parallel spacers and a heat sink.

17. A method according to claim 1 wherein the step of providing isolation grooves comprises providing isolation grooves that provide an electrical path through the diodes.

18. A method according to claim 1 further comprising the step of coating the substrate with flux.

19. A method according to claim 1 further comprising the steps of making to substrate of aluminum nitride and of metallizing the substrate.

20. A method according to claim 1 further comprising the step of providing a corrugated surface on the stacking block for holding the submodules.

21. A method according to claim 1 wherein the step of biasing together the substrate carrier and the stacking block with an elastic bimetallic clip comprises providing a bimetallic clip with two metals of differing coefficients of thermal expansion.

22. A method according to claim 1 wherein the step of heating comprises heating the submodules and the substrate to solder the submodules to the substrate.

23. A method according to claim 1 wherein the step of heating the clip, block, and carrier with the substrate and the submodules therein comprises allowing gravity to act in a direction from the block to the carrier.

24. A method according to claim 1 further comprising the step of providing a heat sink.

* * * * *